United States Patent [19]

Kuze et al.

[11] Patent Number: 4,698,192

[45] Date of Patent: Oct. 6, 1987

[54] APPARATUS FOR MANUFACTURING A LAMINATED UNIT OF CERAMIC GREEN SHEETS

[75] Inventors: Saburo Kuze; Yoshiharu Kato; Shozo Kojima, all of Nagaokakyo, Japan

[73] Assignee: Murata Manufacturing Co., Ltd., Japan

[21] Appl. No.: 714,381

[22] Filed: Mar. 21, 1985

[30] Foreign Application Priority Data

Mar. 28, 1984 [JP] Japan .................................. 59-61709

[51] Int. Cl.⁴ ...................... B29C 31/02; B29C 39/20
[52] U.S. Cl. .................................... 264/101; 101/126; 101/232; 118/412; 118/413; 118/415; 222/561; 264/60; 264/109; 264/132; 425/85; 425/94
[58] Field of Search ..................... 425/91–94, 425/85, 101; 264/62, 60, 61, 132, 133, 101, 169; 118/413, 415, 412; 222/561; 101/126, 232

[56] References Cited

U.S. PATENT DOCUMENTS

| | | | |
|---|---|---|---|
| 333,546 | 1/1886 | Prentiss et al. | 222/561 |
| 1,857,242 | 5/1932 | Edmonson | 118/412 |
| 2,494,378 | 1/1950 | Dexter | 118/412 |
| 2,526,991 | 10/1950 | Biddle | 118/412 |
| 2,695,005 | 11/1954 | Lewin et al. | 118/412 |
| 2,778,319 | 1/1957 | Dorey | 222/561 |
| 2,779,975 | 2/1957 | Lee et al. | 264/61 |
| 3,122,871 | 5/1967 | Mutter | 118/413 |
| 3,189,978 | 6/1965 | Stetson | 264/61 |
| 3,197,529 | 7/1965 | Grelner | 264/62 |
| 3,203,021 | 8/1965 | Pelick | 118/413 |
| 3,308,750 | 3/1967 | Voegelin | 101/288 |
| 3,322,871 | 5/1967 | Noack et al. | 264/61 |
| 3,549,415 | 12/1970 | Capek et al. | 264/61 |
| 3,574,029 | 4/1971 | Ettre | 264/62 |
| 3,891,735 | 6/1975 | North et al. | 264/60 |
| 3,995,551 | 12/1976 | Mitter | 101/228 |
| 4,004,510 | 1/1977 | Roch | 101/228 |
| 4,056,423 | 11/1977 | Hughes | 118/413 |
| 4,111,121 | 9/1978 | Borum | 101/228 |
| 4,219,136 | 8/1980 | Williams | 222/561 |
| 4,295,440 | 10/1980 | Nakai | 118/412 |

FOREIGN PATENT DOCUMENTS 0040913 3/1982 Japan .................................. 264/61

Primary Examiner—Willard E. Hoag
Attorney, Agent, or Firm—Ostrolenk, Faber, Gerb & Soffen

[57] ABSTRACT

An apparatus for manufacturing a laminated unit of ceramic green sheets comprises an endless belt, and an applying apparatus provided at a predetermined position on the running path of the endless belt. The applying apparatus includes a reservoir for storing a ceramic slurry and a moveable blade. When the belt runs with the blade spaced a predetermined distance from the top surface of the endless belt, the ceramic slurry flows out through a gap between the blade and the belt and, thus, is applied on the belt to a predetermined thickness. The applied ceramic slurry is dried by a drier so as to form a ceramic green sheet. A conductive paste is printed on the top surface of the ceramic green sheet by a printing apparatus. The printed conductive paste is dried by a drier. The ceramic green sheet with the conductive paste printed thereon is brought again to the applying apparatus due to the movement of the endless belt, the blade of the applying apparatus is further displaced upward, and ceramic slurry is applied on the previously formed ceramic green sheet. By repeating such applied again on the ceramic green sheet. By repeating such a process, a laminated unit of the ceramic green sheets is obtained.

19 Claims, 12 Drawing Figures

APPARATUS FOR MANUFACTURING A LAMINATED UNIT OF CERAMIC GREEN SHEETS

BACKGROUND OF THE INVENTION

1. Field of the Invention

The present invention relates to an apparatus for manufacturing a unit of laminated ceramic green sheets. More specifically, the present invention relates to a technique for manufacturing a unit of laminated ceramic green sheets that may be incorporated in a laminated capacitor, or multilayer printed circuit board, by way of example.

2. Description of the Prior Art

Products incorporating ceramic green sheets include, for example, a laminated capacitor. When manufacturing a laminated capacitor, a laminated unit of ceramic green sheets is used. Methods of making such a laminated unit of ceramic green sheets, for example include the so-called "doctor blade" method, disclosed in Japanese Patent Publication No. 19975/1965, published on Sept. 6, 1965, and the screen printing method, disclosed in Japanese Patent Publication No. 12008/1984, published on Mar. 19, 1984.

In the conventional doctor blade method, the ceramic green sheets on which conductive paste is printed are formed one by one, and the sheets are then laminated together to form a laminated unit of ceramic green sheets. In this method, the ceramic green sheets have to be laminated to each other one by one to form the laminated unit, and accordingly, this method is complicated and is not well-suited to mass production techniques.

In the screen printing method, a process is repeated wherein a dielectric ceramic slurry is printed with a silk screen to form a ceramic green sheet, and on such sheet a conductive paste is printed to form inner electrodes. Although this screen printing method is more amenable to mass production than the doctor blade method, the screen printing method suffers from the following problems.

In particular, since a screen is employed in this method, not only is the imprint of the screen mesh left intact in the resulting green sheet as a concave-convex pattern, but also the thickness of the resulting ceramic green sheets is difficult to control, making it nearly impracticable to obtain the required thickness.

Moreover, when ceramic green sheets of nonuniform thickness with electrodes thereon are laminated together to form a unit, such lack of uniform thickness of the ceramic green sheets is likely to lead to delamination of the unit. To prevent such an occurrence of delamination, the surface of the ceramic green sheet must be flat. For this reason, an extra procedure is required wherein the ceramic slurry is printed to a thickness equivalent to the thickness of an inner electrode, on any portions of an underlying ceramic green sheet that are not covered by the corresponding inner electrode. Also, when the position of the ceramic slurry printed in the additional process is shifted, difficulty in producing a terrace, or the like, further takes place.

In addition, another problem of the screen printing method is such that if foreign matter is trapped in the screen mesh, the location of such foreign matter results in a pinhole in the resulting sheet. Moreover, if printing with such a soiled screen is made many times, each resulting ceramic green sheet has a similarly located pinhole and, as a consequence, the inner electrodes become short circuited to one another when such ceramic green sheets are incorporated into a product such as a laminated capacitor.

SUMMARY OF THE INVENTION

Accordingly, an object of the present invention is to provide a manufacturing apparatus capable of manufacturing a laminated unit of ceramic green sheets such as that utilized in a laminated capacitor or the like, in an accurate, mass-producible, and efficient manner.

Briefly stated, the present invention provides an apparatus for manufacturing a laminated unit of ceramic green sheets including a reservoir storing a ceramic slurry to be applied, such reservoir being in a fixed position above an endless belt running in a predetermined direction. A blade is attached to the outlet of a reservoir so that it can be displaced in the vertical direction. By lifting the blade step by step in an incremental manner, as the slurry is expelled from the reservoir, the ceramic slurry applied on the endless belt is configured in a sequentially laminated manner.

In accordance with the present invention, laminated units of the ceramic green sheets can be manufactured continuously, and therefore the manufacturing efficiency is good. Also, since no screen is employed, the surface of each sheet is smooth and without pinholes and, thereby, a homogenous laminated unit of ceramic green sheets is obtainable.

In a preferred embodiment in accordance with the present invention, at the downstream side of the reservoir, a printing apparatus is provided to print on the ceramic green sheet an electronic material paste which may comprise, for example, a conductive paste or a resistance paste. In accordance with this preferred embodiment, a laminated capacitor, multilayer printed circuit board and other electrical products incorporating ceramic green sheets can be manufactured efficiently. ;p These objects and further objects, features, aspects and advantages of the present invention will become more apparent from the following detailed description of the embodiments of the present invention when taken in conjunction with accompanying drawings.

DESCRIPTION OF THE PREFERRED EMBODIMENTS

Figure 1:
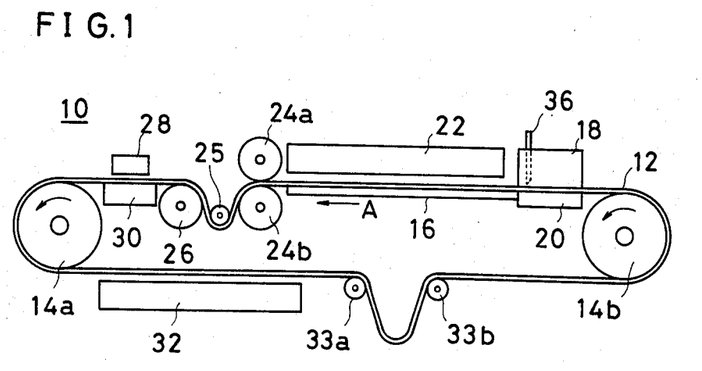
FIG. 1 is a schematic side view showing one embodiment in accordance with the present invention.

FIG. 1 is a schematic side view showing on embodiment in accordance with the present invention. An apparatus 10 for manufacturing a laminated unit of ceramic green sheets comprises an endless belt 12. This endless belt 12 is set around a pair of rollers 14a and 14b. At least the surface or the whole of the endless belt 12 is composed of a synthetic resin of, for example, polypropylene to improve the peeling-off property of the ceramic green sheet formed thereon. Further, the endless belt 12 is sandwiched between a pair of rollers 24a and 24b, while being carried continuously in the direction as shown by an arrow A in FIG. 1. In this case, at least one of the rollers 24a and 24b acts as a driving source, or first driving means, for running the belt 12. One roller 14a around which the endless belt 12 is set acts as a second driving means, being rotation-driven intermittently by a driving source such as a motor (not illustrated). Such intermittent driving is performed for printing by a printing apparatus 28 as described later.

The rollers 24a and 24b drive the endless belt 12 continuously, while the roller 14a runs it intermittently, and therefore a tension roller 25 is installed at the downstream side from the rollers 24a and 24b, and thereby slack of the endless belt 12 due to a difference in the amount of drive between the continuous drive and the intermittent drive is eliminated. This tension roller 25 applies a tension to the endless belt 12 having slack by pushing it down by the weight of the roller itself.

A bed plate 16 is disposed under the running path of the endless belt 12, and this bed plate 16 supports the endless belt 12 from the lower side and also prevents slack or drooping thereof. Above the path of the endless beld 12, an applying part 18 is installed which is explained in detail later in reference to FIG. 2, and a ceramic slurry is applied on the belt 12 by this applying part 18. Under the endless belt 12, a suction bed 20 is installed cooperating with the applying part 18. This suction bed 20 comprises, for example, a negative pressure source connected thereto (not illustrated). The suction bed 20 supports the endless belt 12, and also sucks the endless belt 20 by a negative pressure from the negative pressure source and functions to maintain in a flat state the belt 12 and the ceramic green sheet formed thereon. A drier 22 is installed downstream from the applying part 18. This drier 22 assists in forming the ceramic green sheet by drying the ceramic slurry applied by the applying part 18.

On the running path of the endless belt 12, a printing apparatus 28 is installed downstream from a roller 26, which is explained in detail later in reference to FIG. 10. This printing apparatus 28 is used for forming electrodes (not shown) on the ceramic green sheet which has passed through the drier 22 by the time it reaches the printing apparatus. Such electrodes are used as inner electrodes in the case where the laminated unit of ceramic green sheets is used for a laminated capacitor. Under the endless belt 12, a suction bed 30 for preventing slack of the belt and the ceramic green sheet formed thereon so as to keep them in a flat state is installed on the opposite side of the belt 12 from the printing apparatus 28. The ceramic green sheet on which the electrodes in the form of conductive paste are applied by printing apparatus 28 is transferred to a drier 32 by the belt 12.

Thereafter, the ceramic green sheet is brought again to the position of the applying part 18 by the endless belt 12, and the above-described process is repeated.

Figure 2:
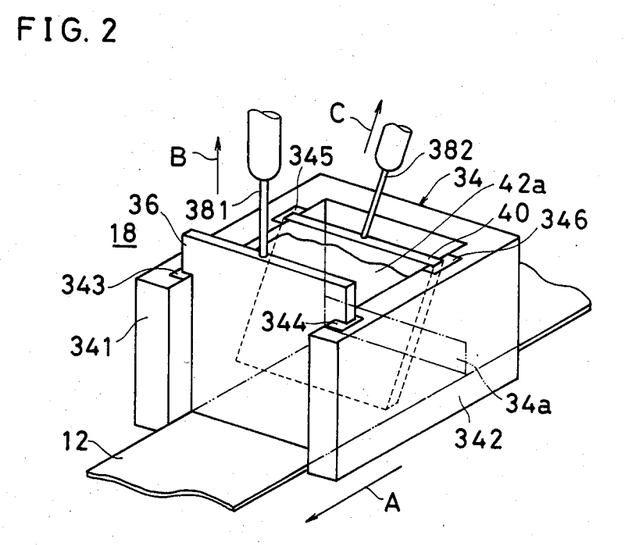
FIG. 2 is a detail view in perspective of a reservoir for dispensing ceramic slurry shown in schematic form in FIG. 1.
Figure 3:
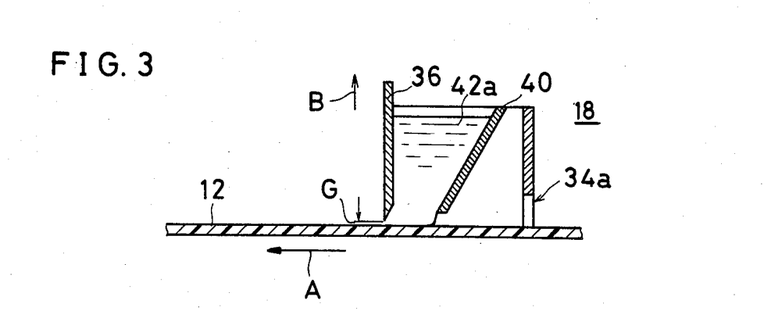
FIG. 3 through FIG. 8 are illustrative views for explaining a sequence of steps of a method of manufacturing a laminated unit of ceramic green sheets in accordance with the invention.

Next, detailed description is made of the applying part 18 in reference to FIG. 2. The applying part 18 comprises a frame 34, which is installed above the endless belt 12 which runs continuously in the direction as shown by the arrow A. Situated along the opposite edges of the endless belt 12, the frame 34 has side walls 341 and 342 extending in the direction of movement of the endless belt 12. On the opposite insides of these side walls 341 and 342, vertical grooves 343 and 344 are formed, respectively. A doctor blade 36 is fitted into these grooves 343 and 344, being held so that it can be displaced in the up-down (vertical) direction. The blade 36 is connected with an operating mechanism (FIG. 9) through a connecting lever 381. The blade 36 can be displaced in the direction shown by an arrow B through the connecting level 381 by means of the operating mechanism. In the rear of the blade 36 in the frame 34, a partition plate 40 is installed in a manner that the bottom end thereof slants in the direction as shown by the arrow C. The partition plate 40 is connected with the operating mechanism (FIG. 9) through a connecting lever 382 and such plate is fitted into grooves 345 and 346 formed on the opposite insides of the side walls 341 and 342 of the frame 34, respectively. A space defined by the blade 36, the partition plate 40 and the side walls 341 and 342 act as a reservoir of a ceramic slurry, and therein a ceramic slurry 42a to be applied is stored. Accordingly, by lifting the blade 36 in the direction as shown by the arrow B, the ceramic slurry 42a stored therein flows out on the endless belt 12.

The grooves 343 and 344 in side walls 341 and 342, respectively, are formed preferably with such a material as a synthetic resin polymer sold under the trademark Teflon, nylon, rubber or the like to prevent the ceramic slurry from flowing out from the side ends of the blade 36 and also to permit smooth displacement of the blade 36. Also, the end faces of the grooves 345 and 346 are formed likewise by such a material as a synthetic resin polymer sold under the trademark Teflon, nylon, rubber or the like.

The bottom end of the partition plate 40 is spaced from the surface of the endless belt 12 by a predetermined spacing, and a hole 34a having a predetermined height is formed in the frame 34 for passage therethrough of the endless belt 12. Accordingly, the ceramic green sheet can pass through the applying part 18 without contacting the frame 34 even in a state where the ceramic green sheet is formed on the endless belt 12. Therefore, by lifting the blade 36 and the partition plate 40 step by step at predetermined spacings, the ceramic slurry is formed on the endless belt 12 in a sequential or laminated manner, and thus a laminated unit of ceramic green sheets can be manufactured.

Next, description is made of the operation of the embodiment shown in FIG. 1 and FIG. 2 with reference to FIG. 3 through FIG. 8. The rollers 14a and 14b and the rollers 24a and 24b are driven, (FIG. 1) and the endless belt 12 runs continuously in the direction as shown by the arrow A. Then, referring to FIG. 3, the blade 36 is lifted in the direction as shown by the arrow B in the applying part 18, and a constant gap G is provided between the bottom end thereof and the surface of the endless belt 12. This gap G is nearly equivalent to a thickness T of the ceramic green sheet (FIG. 8), but is set to a value a little larger than the thickness T. The ceramic slurry 42a can flow out through this gap G in this state.

Figure 4:
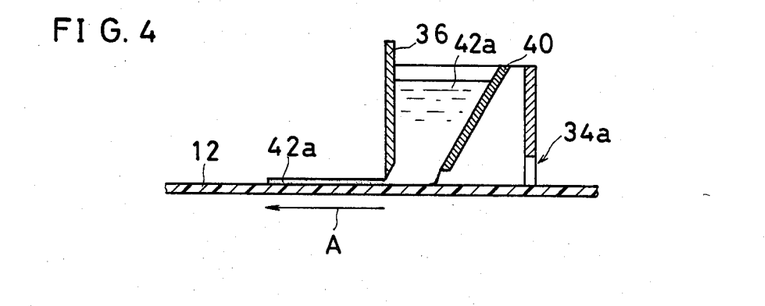

As shown in FIG. 4, the endless belt 12 runs in the direction as shown by the arrow A. Then, the ceramic slurry 42a is applied continuously in the thickness equivalent to the constant gap G (FIG. 3) on the endless belt 12. The ceramic slurry 42a thus applied is brought to the drier 22 (FIG. 1) due to the movement of the endless belt 12. At the drier 22, the ceramic slurry is dried to form a ceramic green sheet.

Figure 5:
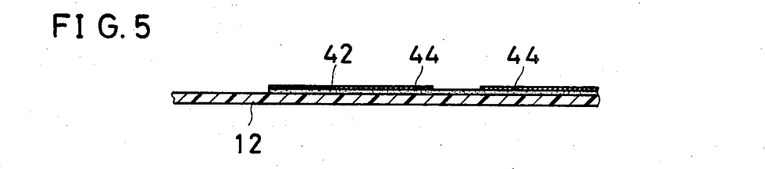
Figure 8:
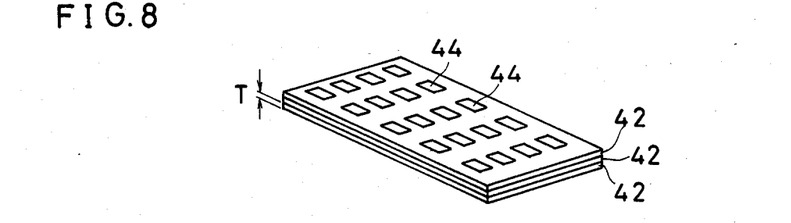

A ceramic green sheet 42 formed on the endless belt 12 as described above is brought to the printing apparatus 28 (FIG. 1) due to the movement of the endless belt 12. In the printing apparatus 28 a material such as a conductive paste for electrodes 44, as shown in FIG. 8, is printed on the ceramic green sheet 42, by for example, the screen printing method. More specifically, the printing apparatus 28 coats the ceramic green sheet 42 by printing thereon the conductive paste to become the electrodes 44 as shown in FIG. 5, for example, by using a mesh screen and a squeezer as shown in FIG. 10. Accordingly, electrodes 44 in the form of conductive paste are printed at predetermined spacings on the ceramic green sheet 42. Thereafter, the ceramic green sheet on which the conductive paste is printed is brought to the drier 32 (FIG. 1). In the drier 32, the conductive paste is dried, and accordingly, the conductive paste is formed into the electrodes 44 as shown in FIG. 5 (but better seen in FIG. 8).

Figure 6:
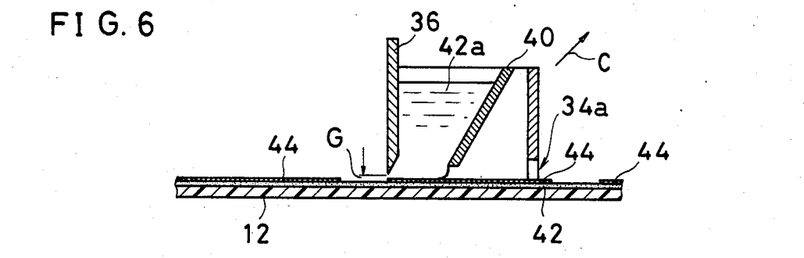

Thus, a first layer of the ceramic green sheet 42 is formed, being brought again to the applying part 18 as shown in FIG. 6. Then, the blade 36 is further lifted in the direction as shown by the arrow B and the partition plate 40 is further lifted in the direction as shown by an arrow C respectively, and thereby the position of the blade 36 is adjusted so that the constant gap G will be present between the surface of the structure formed by the ceramic green sheet 42 and electrodes 44 overlying such sheet which is formed previously, and the lower tip of blade 36; also, the partition plate 40 is adjusted to have a constant gap between the surface of the structure formed by the ceramic green sheet 42 with electrodes 44 thereon to prevent contact with the surface of such structure formed by the ceramic green sheet and electrode thereon.

Figure 7:
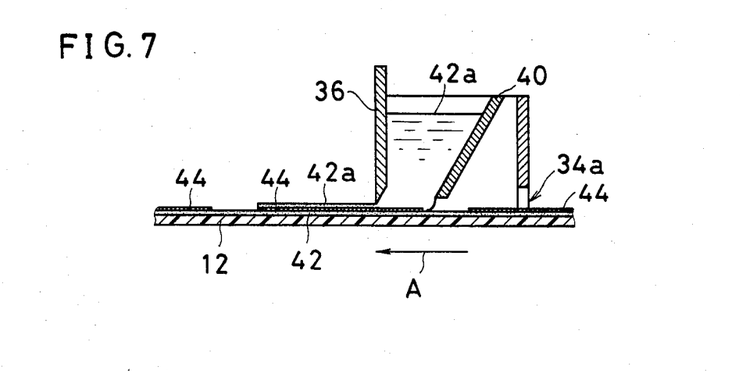

Next, as shown in FIG. 7, the endless belt 12 runs again in the direction as shown by the arrow A. Accordingly, the ceramic slurry 42a is applied again on the ceramic green sheet 42 formed previously. Thereafter, the ceramic green sheet is returned again to the applying part 18 via the printing apparatus 28 and the drier 32. Thereafter, the above-described operation has only to be repeated as required.

Thus, as shown in FIG. 8, the laminated ceramic green sheets 42 having the predetermined thickness T are printed in a laminated state where the electrodes 44 are formed on their respective surfaces. Then, by only dividing the laminated structure of FIG. 8 into pieces of a required size, a laminated unit of ceramic green sheets, such as, for a laminated capacitor is obtained.

Now, further detailed description will be made of controlling the applying apparatus 18 with reference to FIG. 9. A microprocessor 60 is provided to control the applying apparatus 18 (FIGS. 1 and 2). This microprocessor 60 may be used in common to control components other than the applying apparatus 18, such as (with reference to FIG. 1), the printing apparatus 28, a motor (not illustrated) for driving the rollers 24a and 24b, a motor (not illustrated) for intermittently driving the roller 14a and the like.

Outputs of a thickness sensor 64 and two level sensors 66a and 66b are given to the microprocessor 60 via an input interface 62. The thickness sensor 64 is composed of, for example, an ultrasonic transceiver or the like, detecting the thickness of the ceramic green sheet 42 formed on the endless belt 12 based on the time during which the transmitted ultrasonic wave is reflected from the ceramic green sheet 42 formed on the endless belt 12 and is received again. The level sensors 66a and 66b comprise, for example, a pair of conductive electrodes or the like, detecting whether or not the ceramic slurry 42a is present at the position of the sensor based on the state of conduction between the pair of conductive electrodes. The level sensor 66a detects the lower limit of the ceramic slurry 42a and the level sensor 66b detects the upper limit of the ceramic slurry 42a, respectively.

The microcomputer 60 varies the heights of the blade 36 and the partition plate 40 according to the output of the thickness sensor 64. For this purpose, two motors 70 and 74 are connected to the microprocessor or microcomputer 60 via an output interface 68. The motor 70 is connected with the blade 36 through a direction converting mechanism 72, and the motor 74 is connected with the partition plate 40 through a direction converting mechanism 76. The direction converting mechanisms 72 and 76 convert a rotary motion of the motors 70 and 74 into a linear motion in the up-down direction, for example, and may comprise a combination of rack and pinion gear or the like. Accordingly, when the motors 70 and 74 are rotated, the blade 36 and the partition plate 40 are responsively displaced in the up-down direction.

Although not illustrated, an electromagnetic valve of a hopper for feeding the reservoir with the ceramic slurry is connected to the microprocessor 60. Then, if the level sensor 66a detects a low level of the ceramic slurry 42a, the microprocessor 60 gives the electromagnetic valve (not illustrated) a control signal for opening it. Responsively, a fresh supply of reservoir is fed with the ceramic slurry. In reverse, if the level sensor 66b detects a high level of the ceramic slurry 42a, the microprocessor 60 gives the electromagnetic valve a control signal for closing it. Responsively, feeding of the reservoir with the ceramic slurry is stopped. Thus, the reservoir can be automatically fed with the ceramic slurry.

When the thickness sensor 64 detects the thickness of the ceramic green sheet 42 formed on the endless belt 12, the microprocessor 60 gives the motors 70 and 74 control signals for controlling them so as to displace the blade 36 and the partition plate 40 upward in response to the thickness data.

When a portion of the ceramic green sheet 42 formed on the endless belt 12 is of the thickness of, for example, 10 μm, and such portion of sheet 42 is brought under the thickness sensor 64, the microprocessor 60 detects a "10 μm" thickness in response to the signal from the thickness sensor 64. Responsively, the microprocessor 60 gives the motor 70 a command so that ceramic green sheet of the same thickness can be formed on the first layer of the ceramic green sheet 42 by means of displacement of the blade 36 upward by a constant distance. Simultaneously, the microprocessor 60 gives a command to the motor 74, and, responsively, the partition plate 40 is displaced to a higher position so that the ceramic green sheet 42 formed on the endless belt 12 does not contact the partition plate 40.

Figure 10:
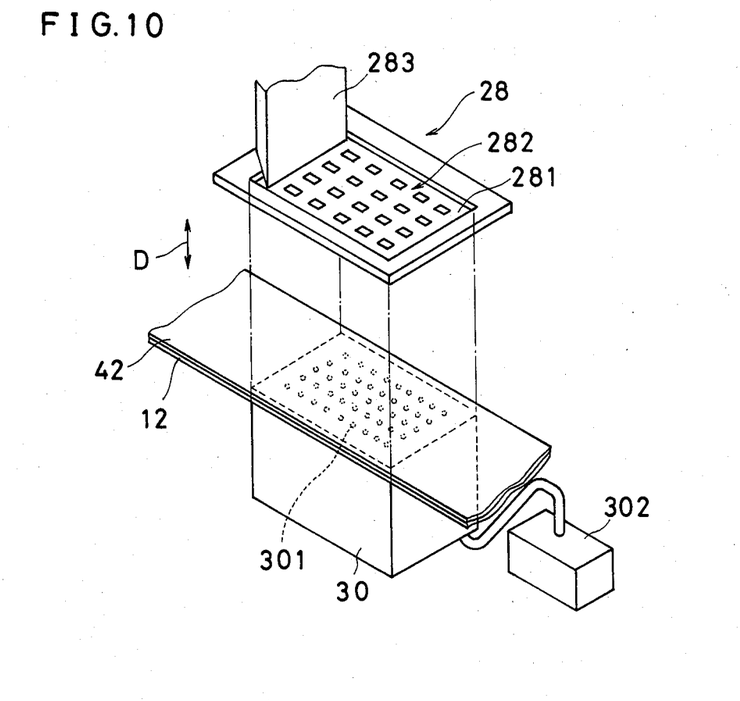
FIG. 10 is a perspective view showing one example of a printing apparatus.

Next, detailed description is given of the printing apparatus 28 with reference to FIG. 10. The printing apparatus 28 comprises a screen 281, and this screen 281 is disposed above a predetermined position of the running path of the endless belt 12, being made movable up and down in the direction as shown by an arrow D. A printing pattern 282 is formed on the screen 281 and corresponds to an electrode pattern as shown in FIG. 8. Associated with the screen 281, a squeezer 283 for applying a conductive paste is provided.

Associated with the printing apparatus 28, the above-described suction bed 30 is provided underneath the endless belt 12 opposite the printing apparatus. On the top surface of this suction bed 30, a large number of fine holes 301 are formed in a distributed manner, and such top surface of the suction bed is preferably in contact with the bottom surface of the endless belt 12. A negative pressure source 302 is connected to the suction bed 30, and this negative pressure source 302 is operated when printing is performed by the printing apparatus 28, and serves to stably hold the belt 12, and, hence, the ceramic green sheet 42 formed thereon.

Note that the suction bed 20 associated with the applying apparatus 18 can be of similar construction to this suction bed 30.

When printing is made, first the negative pressure source 302 is operated to hold the ceramic green sheet 42, and subsequently the screen 281 descends, and comes in contact with the upper surface of the ceramic green sheet 42. Next, conductive paste (not illustrated) is applied on the ceramic green sheet 42 through the screen 281 by means of the squeezer 283. The conductive paste is applied, for example, in an arrangement as shown in FIG. 8 according to the pattern 282.

Figure 11:
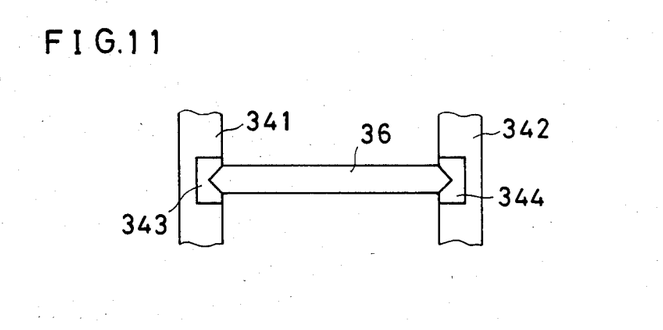
FIG. 11 is an illustrative view showing another example of a blade holding structure.

FIG. 11 is an illustrative view showing another example of the structure wherein the side walls 341 amd 342 of reservoir 34 (FIG. 2) support the blade 36 in a manner such that it can be displaced in the up-down direction. In this example as shown in FIG. 11, both side ends of the blade 36 are wedge-shaped, while the grooves 343 and 344 are correspondingly V-shaped. Accordingly, an outflow of ceramic slurry from the side ends of the blade 36 effectively is prevented. Meanwhile, in this example as shown in FIG. 11, the grooves 343 and 344 are also formed with a synthetic resin material. Although not illustrated, the further grooves 345 and 346 associated with partition plate 40 (FIG. 2) are formed in the same manner.

Figure 9:
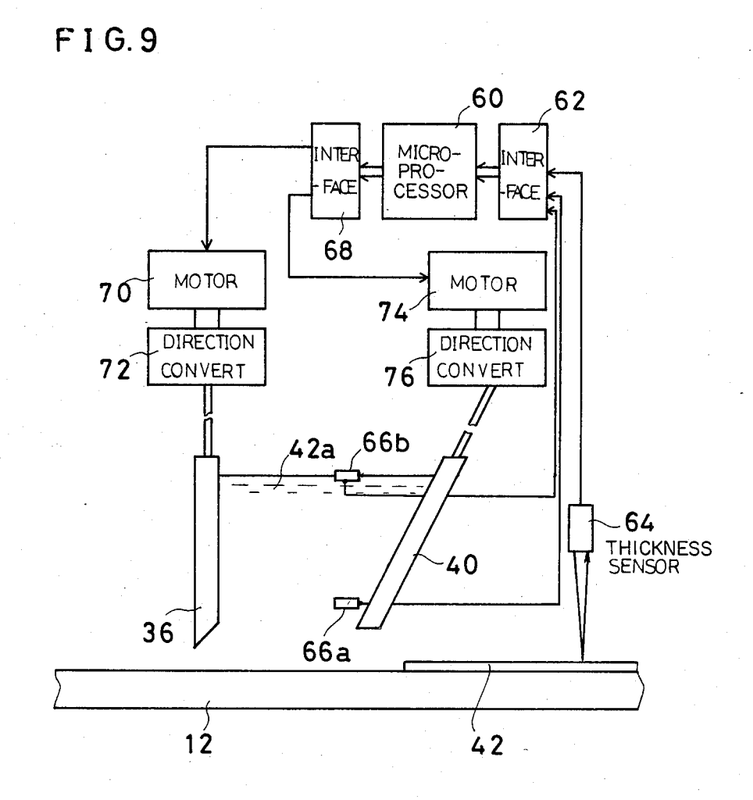
FIG. 9 is a schematic block diagram showing a control system for displacing a blade and a partition plate.

As will be apparent to those skilled in the art, for controlling the displacement of the doctor blade 36 and the partition plate 40, other suitable systems can be employed besides the above-mentioned system as shown in FIG. 9.

Also, in the above-described embodiment, the disclosed printing apparatus is designed to carry out screen printing, but other suitable printing apparatus can be employed. In addition, for the material to be printed, other electronic material paste, such as electrical resistance paste, can be printed and formed on a ceramic green sheet.

Figure 12:
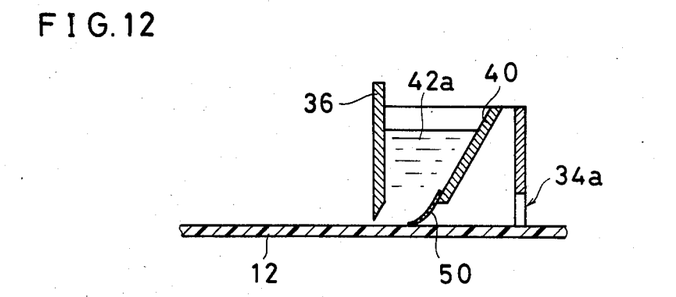
FIG. 12 is a schematic side view in section showing another embodiment of a reservoir for dispensing ceramic slurry in accordance with the present invention.

Furthermore, in the above-described embodiment, the partition plate 40 is disclosed as being connected with an operating mechanism through the connecting lever 382, thereby being made movable in the up-down direction; however, it may be fixed if a sufficient gap is formed in advance to avoid contact with the composite of the ceramic green sheet 42 with electrodes 44 thereon. With partition plate 40 fixed as shown in FIG. 12, a sheet 50 may be suspended from the vicinity of the bottom end of the partition plate so that the ceramic slurry 42a will not leak out from beneath the partition plate 40 to the rear side of the partition plate 40, that is, to the right side of the figure. Accordingly, the ceramic slurry 42a is continued to flow in the direction of movement of the endless belt 12.

Additionally, the present invention can be utilized, for example, for manufacturing a multilayer printed circuit board which is laminated with inner electrodes, in addition to manufacturing the laminated unit of ceramic green sheets for the laminated capacitor as described above.

Although the present invention has been described and illustrated in detail, it is clearly understood that the same is by way of illustration and example only and is not to be taken by way of limitation, and, thus, it is intended that the spirit and scope of the present invention be limited only by the appended claims.

What is claimed is:

1. A method of manufacturing a unit of laminated ceramic green sheets, comprising the steps of:
   (a) applying ceramic slurry on an endless belt running in a predetermined direction to a predetermined thickness, said belt being driven continuously through an applying location while carrying out said applying step;
   (b) curing said applied ceramic slurry and thereby forming a ceramic green sheet;
   (c) applying a further coating of ceramic slurry on said cured ceramic green sheet;
   (d) curing said further coating of ceramic slurry applied on said ceramic green sheet and thereby forming a further ceramic green sheet;
   (e) driving said belt to carry at least one of said ceramic green sheets to a printing location following the formation thereof;
   (f) printing an electronic material paste on said at least one ceramic green sheet, said belt being driven intermittently through said printing location while carrying out said printing step; and
   (g) drying said printed electronic material paste.

2. A manufacturing method in accordance with claim 1, further comprising a repetition of said steps (c) and (d).

3. A manufacturing apparatus for manufacturing a unit of laminated ceramic green sheets, comprising:
   an endless belt moveable in a downstream direction along a predetermined running path, at least the outermost surface of said endless belt comprising a synthetic resin material;
   a reservoir for storing a ceramic slurry which is situated above a predetermined position on the running path of said endless belt and which has an open outlet facing a main surface of said endless belt so that said slurry is in constant contact with said main surface of said belt and with any material located on said surface of said belt;
   a doctor blade forming part of said reservoir and being located at a downstream end of said reservoir, said doctor blade being displaceable in a vertical direction so as to adjust the distance between said belt and a doctoring surface of said blade; and
   blade displacement means connected to said blade for displacing said blade along said vertical direction so as to meter the amount of slurry that is applied to said main surface of said belt and to any such material located on said main surface of said belt;

a first drying means which is situated downstream of said reservoir and adjacent said endless belt and which is effective for drying said applied ceramic slurry so as to form a ceramic green sheet;

a printing means which is situated downstream of said first drying means and adjacent said endless belt and which is effective for printing an electronic material paste on said ceramic green sheet;

a first driving means for continuously moving said endless belt through said reservoir; and a second driving means for intermittently moving said endless belt through said printing means.

4. A manufacturing apparatus in accordance with claim 3, further comprising a tension means which is situated on said endless belt between said reservoir and said printing means and which is effective for removing slack in said endless belt.

5. A manufacturing apparatus in accordance with claim 4, further comprising a slack forming means which adjoins said endless belt at a position between said printing means and said reservoir and is for producing a slack on said endless belt.

6. A manufacturing apparatus in accordance with claim 3, further comprising a first suction means which is situated beneath said reservoir and under said endless belt and is for applying suction to said endless belt.

7. A manufacturing apparatus in accordance with claim 6, further comprising a second suction means which is situated beneath said printing means and under said endless belt and is for applying suction to said endless belt.

8. A manufacturing apparatus for manufacturing a unit of laminated ceramic green sheets, comprising:

an endless belt moveable in a downstream direction along a predetermined running path;

a reservoir for storing a ceramic slurry which is situated above a predetermined position on the running path of said endless belt and which has an open outlet facing a main surface of said endless belt so that said slurry is in constant contact with said main surface of said belt and with any material located on said surface of said belt;

a doctor blade forming part of said reservoir and being located at a downstream end of said reservoir, said doctor blade being displaceable in a vertical direction so as to adjust the distance between said belt and a doctoring surface of said blade; and blade displacement means connected to said blade for displacing said blade along said vertical direction so as to meter the amount of slurry that is applied to said main surface of said belt and to any such material located on said main surface of said belt;

a first drying means which is situated downstream of said reservoir and adjacent said endless belt and which is effective for drying said applied ceramic slurry to thereby form a ceramic green sheet;

a printing means which is situated downstream of said first drying means and adjacent said endless belt and which is effective for printing an electronic material paste on said ceramic green sheet;

a second drying means which is situated downstream of said printing means and adjacent said endless belt and which is effective for drying said printing electronic material paste;

a first driving means for continuously moving said endless belt through said reservoir; and a second driving means for intermittently moving said endless belt through said printing means.

9. A manufacturing apparatus in accordance with claim 8, wherein at least the outermost surface of said endless belt comprises a synthetic resin material.

10. A manufacturing apparatus in accordance with claim 8, further comprising a tension means which is situated on said endless belt between said reservoir and said printing means and which is effective for removing slack in said endless belt.

11. A manufacturing apparatus in accordance with claim 10, further comprising a slack forming means which adjoins said endless belt at a position between said printing means and said reservoir and is for producing a slack on said endless belt.

12. A manufacturing apparatus in accordance with claim 8, further comprising a first suction means which is situated beneath said reservoir and under said endless belt and is for applying suction to said endless belt.

13. A manufacturing apparatus in accordance with claim 12, further comprising a second suction means which is situated beneath said printing means and under said endless belt and is for applying suction to said endless belt.

14. A manufacturing apparatus in accordance with claim 8, wherein said reservoir includes a frame with an operable side which is situated transverse to said endless belt and which includes said blade, said operable side being so arranged as to permit vertical displacement of said blade.

15. A manufacturing apparatus in accordance with claim 14, wherein said blade includes at both of its side edges a groove or a protrusion extending in a vertical direction, and said openable side of said frame includes a pair of confronting protrusions or grooves slidably mating with said grooves or protrusions on the side edges of said blade, respectively.

16. A manufacturing apparatus in accordance with claim 15, wherein said grooves and said protrusions are configured with a V-shaped cross-section.

17. A manufacturing apparatus in accordance with claim 14, further comprising a partition plate attached to said frame and transverse to said blade with a bottom end thereof slanted in the direction of said blade.

18. A manufacturing apparatus in accordance with claim 17, further comprising a sheet member attached to the bottom end of the partition plate.

19. A manufacturing apparatus in accordance with claim 17, further comprising a means for displacing said partition plate in a direction parallel with the main surface thereof.

* * * * *